US011145636B1

(12) United States Patent
Chen et al.

(10) Patent No.: US 11,145,636 B1
(45) Date of Patent: Oct. 12, 2021

(54) METHOD FOR MAKING INKJET-PRINTED ENCAPSULATED QUANTUM DOTS, LIGHT CONVERSION UNIT, AND MICRO LED DISPLAY PANEL

(71) Applicant: NATIONAL TSING HUA UNIVERSITY, Hsinchu (TW)

(72) Inventors: Hsueh-Shih Chen, Hsinchu (TW); Shih-Jung Ho, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 16/920,140

(22) Filed: Jul. 2, 2020

(30) Foreign Application Priority Data

Apr. 8, 2020 (TW) .................................. 109111812

(51) Int. Cl.
*H01L 25/13* (2006.01)
*H01L 33/50* (2010.01)

(52) U.S. Cl.
CPC ............ *H01L 25/13* (2013.01); *H01L 33/502* (2013.01); *H01L 2933/0041* (2013.01)

(58) Field of Classification Search
CPC ................... H01L 25/13; H01L 33/502; H01L 2933/0041
See application file for complete search history.

(56) References Cited

U.S. PATENT DOCUMENTS 10,407,613 B2 * 9/2019 Zhao ...................... C09K 11/02

* cited by examiner

*Primary Examiner* — David Vu

(57) ABSTRACT

A method for making inkjet-printed encapsulated quantum dots and a light conversion unit using the inkjet-printed encapsulated quantum dots are disclosed. The light conversion unit comprises: a substrate, a light convertor carrying layer having several accommodating grooves, several first micro encapsulated QD structures, and several second micro encapsulated QD structures. In case of letting the substrate has a hydrophobic surface, at least one inkjet-printing nozzle is utilized for injecting a first QDs solution and a second QDs solution into the accommodating grooves by a form of droplet, such that one third of the accommodating grooves are formed with the first micro encapsulated QD structure, and another one third of the accommodating grooves formed with the second micro encapsulated QD structure. Moreover, a micro LED display panel having the light conversion unit exhibits a color gamut that is approximately 110% NTSC.

20 Claims, 17 Drawing Sheets

METHOD FOR MAKING INKJET-PRINTED ENCAPSULATED QUANTUM DOTS, LIGHT CONVERSION UNIT, AND MICRO LED DISPLAY PANEL

BACKGROUND OF THE INVENTION

1. Field of the Invention

The present invention relates to the technology field of micro LED display panel, and more particularly to a method for making inkjet-printed encapsulated quantum dots, light conversion unit, and micro LED display panel.

2. Description of the Prior Art

It is well known that liquid crystal display (LCD) device and plasma display device are both classified as flat panel display device, wherein LCD device is one kind of non-self-emissive flat panel display device, and commonly comprises a white LED backlight module, a liquid crystal panel and a color filter. After the white LED backlight module is controlled by a driver circuit, a white backlight is therefore generated so as to be directed to sequentially pass through the liquid crystal panel and the color filter, thereby being converted to a red light, a green light and a blue light for being as three sub-pixels of red, green and blue. According to statistical data, the commercial LCD device using the white LED backlight module can exhibit a best color gamut merely reaching to 72% NTSC. On the other hand, owing to the fact that the brightness of the commercial LCD device fails to be enhanced to over 1,000 nits, the commercial LCD device shows an inadequate visual recognition of color image while being used as an outdoor display device.

Differing from the LCD device, LED display device and OLED display device are both classified as self-emissive flat panel display. It is worth explaining that, Mini LED was first proposed by Epistar Corporation, and commonly has a die diagonal length in a range between 50 μm and 60 μm. Furthermore, micro LED (μ-LED) technology was first invented by the research group of Hongxing Jiang and Jingyu Lin of Texas Tech University while they were at Kansas State University. According to the definition, micro LED has a die diagonal length that is smaller than 50 μm. Because the mini LED and the micro LED both exhibit outstanding advantages of low power consumption, fast response time, high brightness and contrast, and being easily driven through addressed column wires row wires, LED display device having a self-emissive sub-pixel array that is arranged by M×N micro LEDs or mini LEDs is hence rapidly developed, and is further considered to have the potential on replacing the conventional LCD device, thereby becoming a predominate display device.

Currently, mass production of the tricolor RGB micro LED display device has encountered difficulty in the mass transfer of millions or billions of micro LEDs that are adopted for forming the forgoing self-emissive sub-pixel array. In view of that, manufacturer of micro LED display panel makes M×N blue light μ-LED components on a substrate by using photolithography, and subsequently disposed a quantum dots (QDs) light conversion unit on the M×N blue light μ-LED components. As a result, blue lights emitted from the M×N blue light μ-LED components are converted to red lights, green lights and blue lights by the ODs light conversion unit, such that the red lights, green lights and blue lights form M×N sub-pixels of red, green and blue.

China patent CN108664165A has disclosed a μ-LED display panel using QDs light conversion unit. FIG. 1 illustrates a cross-sectional view of the μ-LED display panel disclosed by China patent CN108664165A. As FIG. 1 shows, the μ-LED display panel 1' comprises: a first substrate 10', M×N blue light μ-LED components 20', a second substrate 60', and a light-shielding layer 30', wherein the M×N blue light μ-LED components 20' are formed on the first substrate 10', and the second substrate 60' is disposed between the first substrate 10' and the M×N blue light μ-LED components 20'. As described in more detail below, the light-shielding layer 30' M×N through holes 31' for respectively facing to the M×N blue light μ-LED components 20'. Moreover, there are one third of the M×N through holes 31' filled with a red QDs material 81', and another one third of the M×N through holes 31' are filled with a green QDs material 82'. Furthermore, the remaining through holes 31' are not filled with any QDs material.

According to the disclosures of China patent CN108664165A, it is known that the light-shielding layer 30' is made of an organic material such as black photoresist, and the second substrate 60', the light-shielding layer 30', the (M×N)/3 through holes 31' filled with the red QDs material 81', the (M×N)/3 through holes 31' filled with the green QDs material 82', and the remaining (M×N)/3 through holes 31' constitute a QDs light conversion unit that is disposed over the first substrate 10' and the M×N blue light μ-LED components 20'. In general, the light-shielding layer 30' needs to have a thickness of at least 5 μm. However, it is difficult to make the thickness of the light-shielding layer 30' to be greater than 5 μm. Practical experiences indicate that, when the thickness of the light-shielding layer 30' is greater than 5 μm, walls of each of the through holes 31' may become askew, causing that each of the through holes 31' fails to align each of the blue light μ-LED components 20'.

In addition, practical experiences also indicate that, the filling amount of the red QDs material 81' in the through holes 31' is often not equal to the filling amount of the green QDs material 82' in the through holes 31'. It should be understood that, in case of the red QDs material 81' in the through holes 31' having the filling amount that fail to be equal to the filling amount of the green QDs material 82' in the through holes 31', the μ-LED display panel 1' certainly exhibits a color saturation not as expected.

From above descriptions, it is understood that there is still room for improvement in the conventional μ-LED display panel using QDs light conversion unit. In view of that, inventors of the present application have made great efforts to make inventive research and eventually provided a method for making inkjet-printed encapsulated quantum dots, light conversion unit, and micro LED display panel.

SUMMARY OF THE INVENTION

The primary objective of the present invention is to disclose a method for making inkjet-printed encapsulated quantum dots, a light conversion unit having the inkjet-printed encapsulated quantum dots, and a micro LED display panel having the light conversion unit. The light conversion unit comprises: a transparent substrate, a light convertor carrying layer having M×N accommodating groove, (M×N)/3 first micro encapsulated QD structures that are made from a first QDs solution, and (M×N)/3 second micro encapsulated QD structures that are made from a second QDs solution. In case of letting the transparent substrate have a hydrophobic surface, at least one inkjet-printing nozzle is utilized for injecting the first QDs solution and the second QDs solution into the accommodating grooves by a form of droplet, such that one third of the (M×N) accommodating grooves are formed with the first micro encapsulated QD structure, and another one third of the (M×N) accommodating grooves formed with the second micro encapsulated QD structure. Moreover, experimental result has reported that, the micro LED display panel having the forgoing light conversion unit exhibits excellent color gamut that is approximately 110% NTSC.

In order to achieve the primary objective of the present invention, the inventor of the present invention provides an embodiment for the method for making inkjet-printed encapsulated quantum dots, comprising steps of:
providing a substrate having a hydrophobic surface and a quantum dots (QDs) solution comprising at least one quantum dot (QD), a water solvent and a solute having a cohesion force;
using an inkjet-printing nozzle to carry out an inkjet-printing of the QDs solution on the hydrophobic surface of the substrate, such that a droplet of the QDs solution is formed on the hydrophobic surface; and
applying a drying process to the droplet of the QDs solution, so as to make a volume of the droplet shrink with an increase of a drying time, thereby forming a micro encapsulated QD structure on the substrate.

For achieving the primary objective of the present invention, the inventor of the present invention also provides an embodiment for the light conversion unit, comprising:
a transparent substrate;
a light convertor carrying layer, being formed on a top surface of the transparent substrate, and being made of a metal material or a metal oxide material;
a plurality of first through holes, being formed on the light convertor carrying layer, and being arranged to M/3 rows and M/3 columns, wherein each of the plurality of first through holes form a first accommodating groove in combination with the top surface of the transparent substrate;
a plurality of second through holes, being formed on the light convertor carrying layer, and being arranged to M/3 rows and M/3 columns, wherein each of the plurality of second through holes form a second accommodating groove in combination with the top surface of the transparent substrate;
a plurality of third through holes, being formed on the light convertor carrying layer, and being arranged to M/3 rows and M/3 columns, wherein each of the plurality of third through holes form a third accommodating groove in combination with the top surface of the transparent substrate;
a first quantum dots (QDs) solution, comprising at least one red quantum dot (QD), a water solvent and a first solute having a cohesion force, wherein the first QDs solution is dropped into each of the first accommodating grooves by using an inkjet-printing nozzle, so as to form a first droplet in each of the first accommodating grooves; and
a second QDs solution, comprising at least one green QD, the water solvent and a second solute having the cohesion force, wherein the second QDs solution is dropped into each of the second accommodating grooves by using the inkjet-printing nozzle, so as to form a second droplet in each of the second accommodating grooves;
wherein in case of letting the top surface of the substrate be a hydrophobic surface so as to make the cohesion force of the first solute and the cohesion force of the second solute be both greater than a driving force for impelling outward-bound flow that is induced by a coffee ring effect, the first droplet and the second droplet being eventually converted to a first micro encapsulated QD structure and a second micro encapsulated QD structure after applying a drying process to the first droplet and the second droplet, thereby making each of the first accommodating grooves have the first micro encapsulated QD structure therein, and simultaneously making each of the second accommodating grooves have the second micro encapsulated QD structure therein;
wherein M and N are both a positive integer.

In one practicable embodiment, the forgoing light conversion unit of the present invention further comprises a third QDs solution that comprises at least one blue QD, the water solvent and a third solute having the cohesion force, wherein the third QDs solution is dropped into each of the third accommodating grooves by using the inkjet-printing nozzle, so as to form a third droplet in each of the third accommodating grooves; wherein the third droplet is eventually converted to a third micro encapsulated QD structure after applying the drying process to the third droplet, thereby making each of the third accommodating grooves have the third micro encapsulated QD structure therein.

In the embodiment of the forgoing light conversion unit, the first micro encapsulated QD structure comprises a first encapsulation body that is formed by the first solute and at least one red QD that is enclosed in the first encapsulation body, the second micro encapsulated QD structure comprises a second encapsulation body that is formed by the second solute and at least one green QD that is enclosed in the second encapsulation body, and the third micro encapsulated QD structure comprises a third encapsulation body that is formed by the third solute and at least one blue QD that is enclosed in the third encapsulation body.

In the embodiment of the forgoing light conversion unit, the first solute, the second solute and the third solute are all selected from the group consisting of LiCl, NaCl, KCl, LiI, NaI, KI, LiBr, NaBr, and KBr.

In one practicable embodiment, the forgoing light conversion unit of the present invention further comprises a surfactant that is further added into the first QDs solution, the second QDs solution and the third QDs solution, so as to effectively reduce a formation of at least one satellite droplet in case of the first droplet, the second droplet and the third droplet are injected by the inkjet-printing nozzle.

In the embodiment of the forgoing light conversion unit, the first solute, the second solute and the third solute all having a concentration in a range between 0.5 wt % and 5.5 wt %.

In the embodiment of the forgoing light conversion unit, the red QD, the green QD and the blue QD are all provided with a surface hydrophilic layer after a surface modification process is applied to the red QD, the green QD and the blue QD.

Moreover, in order to achieve the primary objective of the present invention, the inventor of the present invention also provides an embodiment for the micro LED display panel, comprising:
a substrate;
M×N micro LED components, being disposed on the substrate;
a transparent substrate, being disposed on the substrate and the M×N micro LED components;
a light convertor carrying layer, being formed on a top surface of the transparent substrate, and being made of a metal material or a metal oxide material;
a plurality of first through holes, being formed on the light convertor carrying layer, and being arranged to M/3 rows and M/3 columns, wherein each of the plurality of first through holes form a first accommodating groove in combination with the top surface of the transparent substrate;

a plurality of second through holes, being formed on the light convertor carrying layer, and being arranged to M/3 rows and M/3 columns, wherein each of the plurality of second through holes form a second accommodating groove in combination with the top surface of the transparent substrate;

a plurality of third through holes, being formed on the light convertor carrying layer, and being arranged to M/3 rows and M/3 columns, wherein each of the plurality of third through holes form a third accommodating groove in combination with the top surface of the transparent substrate;

a first quantum dots (QDs) solution, comprising at least one red quantum dot (QD), a water solvent and a first solute having a cohesion force, wherein the first QDs solution is dropped into each of the first accommodating grooves by using an inkjet-printing nozzle, so as to form a first droplet in each of the first accommodating grooves; and a second QDs solution, comprising at least one green QD, the water solvent and a second solute having the cohesion force, wherein the second QDs solution is dropped into each of the second accommodating grooves by using the inkjet-printing nozzle, so as to form a second droplet in each of the second accommodating grooves;

wherein in case of letting the top surface of the substrate be a hydrophobic surface so as to make the cohesion force of the first solute and the cohesion force of the second solute be both greater than a driving force for impelling outward-bound flow that is induced by a coffee ring effect, the first droplet and the second droplet being eventually converted to a first micro encapsulated QD structure and a second micro encapsulated QD structure after applying a drying process to the first droplet and the second droplet, thereby making each of the first accommodating grooves have the first micro encapsulated QD structure therein, and simultaneously making each of the second accommodating grooves have the second micro encapsulated QD structure therein;

wherein M and N are both a positive integer.

In one practicable embodiment, the forgoing micro LED display panel of the present invention further comprises a third QDs solution that comprises at least one blue QD, the water solvent and a third solute having the cohesion force, wherein the third QDs solution is dropped into each of the third accommodating grooves by using the inkjet-printing nozzle, so as to form a third droplet in each of the third accommodating grooves; wherein the third droplet is eventually converted to a third micro encapsulated QD structure after applying the drying process to the third droplet, thereby making each of the third accommodating grooves have the third micro encapsulated QD structure therein.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a method for making inkjet-printed encapsulated quantum dots, a light conversion unit having the inkjet-printed encapsulated quantum dots, and a micro LED display panel having the light conversion unit, embodiments of the present invention will be described in detail with reference to the attached drawings hereinafter.

Figure 1:
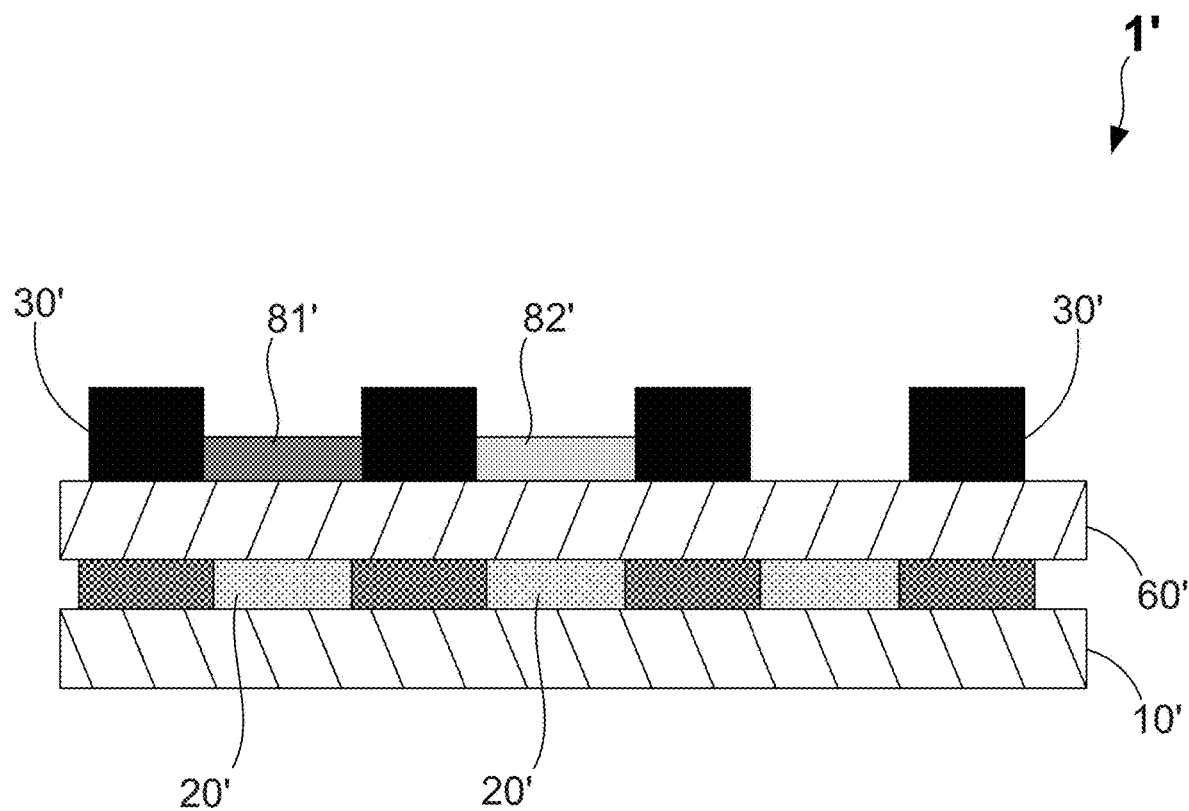
FIG. 1 shows a cross-sectional view of the display panel disclosed by China patent CN108664165A.
Figure 2:
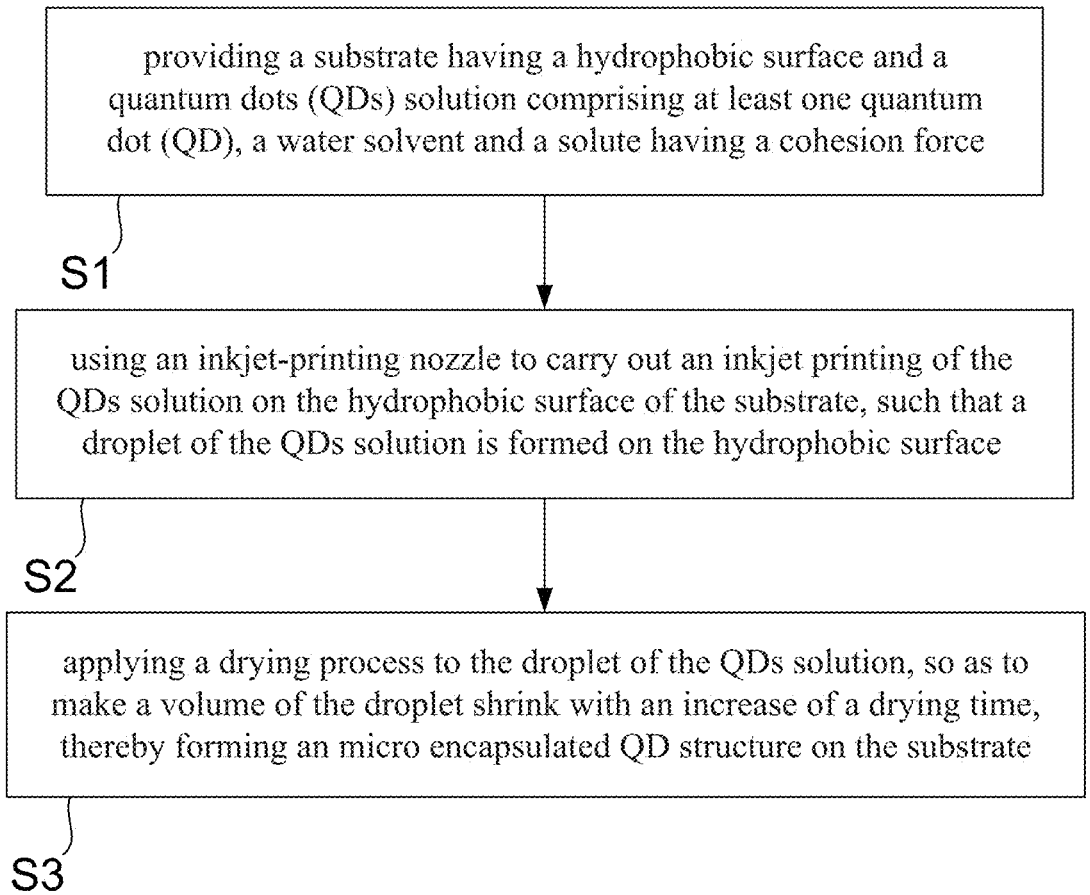
FIG. 2 shows a flowchart diagram of a method for making inkjet-printed encapsulated quantum dots according to the present invention.

With reference to FIG. 2, there is shown a flowchart diagram of a method for making inkjet-printed encapsulated quantum dots according to the present invention. As FIG. 2 shows, the method for making inkjet-printed encapsulated quantum dots (QDs) of the present invention mainly comprises following steps:

S1: providing a substrate having a hydrophobic surface and a quantum dots (QDs) solution comprising at least one quantum dot (QD), a water solvent and a solute having a cohesion force;

S2: using an inkjet-printing nozzle to carry out an inkjet printing of the QDs solution on the hydrophobic surface of the substrate, such that a droplet of the QDs solution is formed on the hydrophobic surface; and S3: applying a drying process to the droplet of the QDs solution, so as to make a volume of the droplet shrink with an increase of a drying time, thereby forming a micro encapsulated QD structure on the substrate.

Continuously, following paragraphs will detailedly introduce a light conversion unit having the forgoing inkjet-printed encapsulated QDs and a micro LED display panel using the forgoing light conversion unit.

First Embodiment

Figure 3:
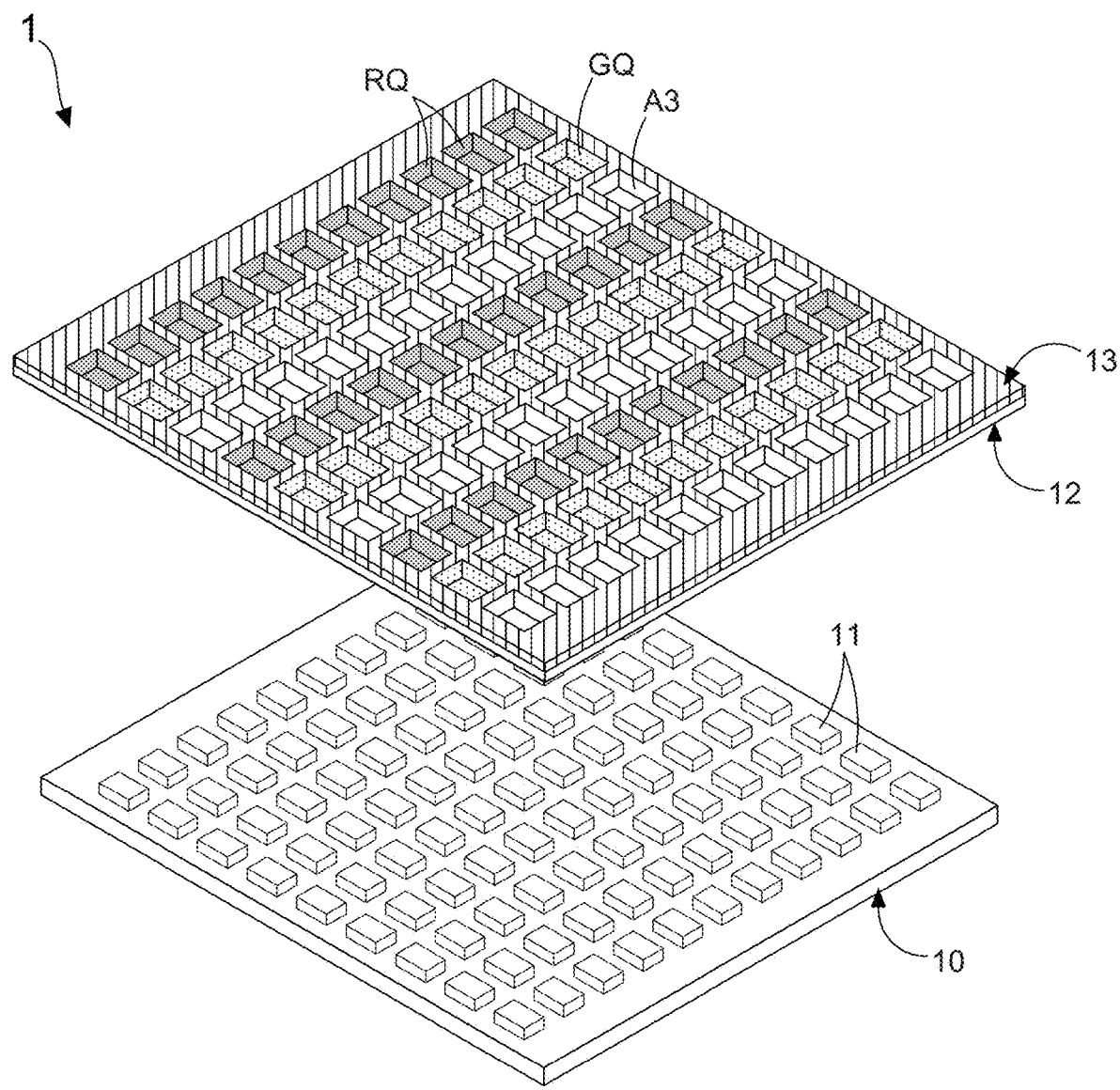
FIG. 3 shows a schematic stereo diagram of a micro LED display panel with a light conversion unit using the inkjet-printed encapsulated quantum dots according to the present invention.
Figure 4:
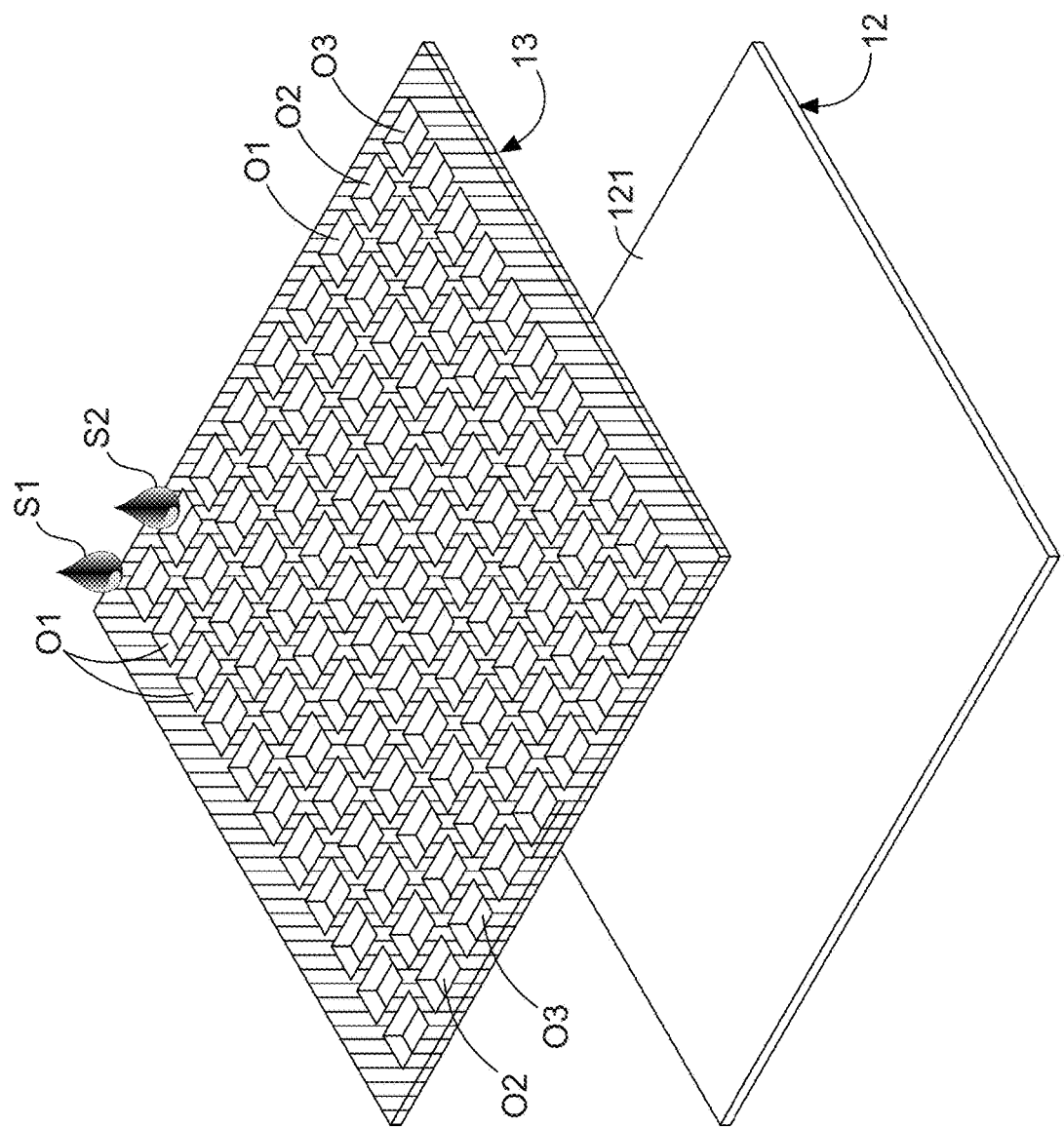
FIG. 4 shows a schematic stereo exploded diagram of the light conversion unit using the inkjet-printed encapsulated quantum dots according to the present invention.
Figure 5:
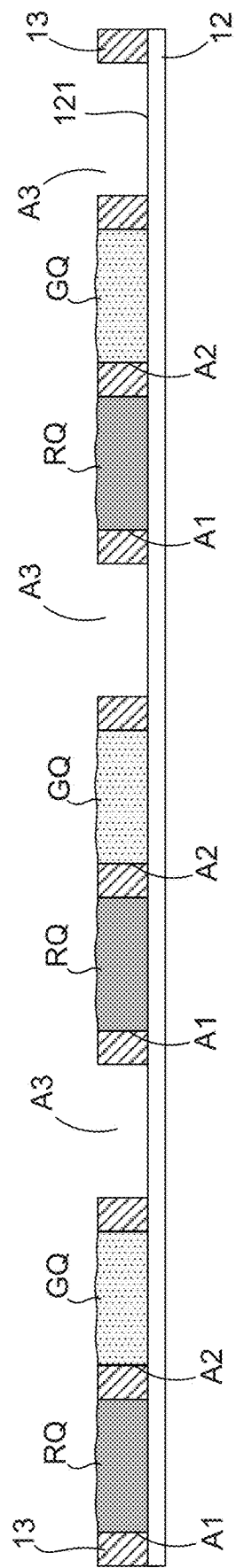
FIG. 5 shows a cross-sectional view of the light conversion unit using the inkjet-printed encapsulated quantum dots according to the present invention.

FIG. 3 shows a schematic stereo diagram of a micro LED display panel with a light conversion unit using the inkjet-printed encapsulated quantum dots according to the present invention. As FIG. 3 shows, the micro LED display panel 1 of the present invention mainly comprises a substrate 10, M×N micro LED components 11, and a light conversion unit. FIG. 4 shows a schematic stereo exploded diagram of the light conversion unit using the inkjet-printed encapsulated quantum dots according to the present invention. Moreover, FIG. 5 shows a cross-sectional view of the light conversion unit using the inkjet-printed encapsulated quantum dots according to the present invention. According to the particular design of the present invention, the M×N micro LED components 11 are disposed on the substrate 10, and the light conversion unit comprises a transparent substrate 12, a light convertor carrying layer 13, a plurality of first through holes O1, a plurality of second through holes O2, a plurality of third through holes O3, (M×N)/3 first micro encapsulated QD structures RQ that are made from a first quantum dots (QDs) solution, and (M×N)/3 second micro encapsulated QD structures GQ that are made from a second QDs solution.

As described in more detail below, the transparent substrate 12 is being disposed on the substrate 10 and the M×N micro LED components 11, and is made of a material that is selected from the group consisting of polyethylene terephthalate (PET), Poly(ether sulfones) (PES) and glass. On the other hand, the light convertor carrying layer 13 is formed on a top surface 121 of the transparent substrate 12, and is made of a metal material or a metal oxide material. It is worth further explaining that, the light convertor carrying layer 13 exhibits an outstanding light-shieling property, and has a thickness that is at least 1 µm. In one embodiment, the metal material mentioned above is selected from the group consisting of gold (Au), copper (Cu), aluminum (Al), silver (Ag), chromium (Cr), molybdenum (Mo), titanium (Ti), indium (In), antimony (Sb), and alloy comprising two or more of the forgoing metal materials. Moreover, the metal oxide material mentioned above is selected from the group consisting of copper oxide, aluminum oxide, silver oxide, chromium oxide, molybdenum oxide, titanium oxide, indium oxide, antimony oxide, and compound comprising two or more of the forgoing metal oxide materials.

Please refer to FIG. 3, FIG. 4 and FIG. 5 again. In the present invention, there are a plurality of first through holes O1, a plurality of second through holes O2 and a plurality of third through holes O3 provided on the light convertor carrying layer 13, and the first, second and third through holes (O1, O2, O3) are all arranged to M/3 rows and M/3 columns. As such, each of the plurality of first through holes O1 form a first accommodating groove A1 in combination with the top surface 121 of the transparent substrate 12, each of the plurality of second through holes O2 form a second accommodating groove A2 in combination with the top surface 121 of the transparent substrate 12, and each of the plurality of third through holes O3 form a third accommodating groove A3 in combination with the top surface 121 of the transparent substrate 12.

It is worth particularly explaining that, the present invention utilize the forgoing method to make at least one inkjet-printed encapsulated quantum dot (QD) on each of the first accommodating grooves A1, each of the second accommodating grooves A2, and each of the third accommodating grooves A3. Therefore, the present invention configures a first quantum dots (QDs) solution that comprises at least one red quantum dot (QD), a water solvent and a first solute having a cohesion force, and the first QDs solution is dropped into each of the first accommodating grooves A1 by using an inkjet-printing nozzle, so as to form a first droplet S1 in each of the first accommodating grooves A1. Herein, it needs to explain that, the first solute has a concentration in a range between 0.5 wt % and 5.5 wt %. In addition, the red QD that is dissolved in the water solvent is provided with a surface hydrophilic layer by receiving a surface modification treatment. For example, a ligand exchanging technology can be utilized to replace an oleic acid ligand layer with a 3-mercaptopropionic acid (MPA) layer. According to the particular design of the present invention, in case of letting the top surface 121 of the substrate 12 be a hydrophobic surface, the cohesion force of the first solute contained in the first droplet S1 is led to be greater than a driving force for impelling outward-bound flow that is induced by a coffee ring effect. In such case, the first droplet S1 is eventually converted to a first micro encapsulated QD structure RQ after applying a drying process to the first droplet S1, thereby making each of the first accommodating grooves A1 have the first micro encapsulated QD structure RQ therein.

The coffee-ring effect (CRE) is a tendency for solute to segregate at the edge of a droplet of a solution that is dropped onto a substrate surface. As explained in more detail below, CRE is omnipresent in drop casting, and it is due to solvent evaporation during film assembly that stimulates capillary flows within the droplet that in turn displace solute particles to the three-phase contact line. As a result, solute particles are susceptible to the radially outward flow of fluid that drives the coffee-ring effect, such that particle accumulation at the dry film boundaries is accelerated, and a coffee ring is therefore formed.

Therefore, for avoiding the first solute and the red QD that are contained in the first droplet S1 from being made away from the center of the first droplet S1, the present invention particularly makes the transparent substrate 12 have a hydrophobic top surface 121, as such, after using an inkjet-printing nozzle to carry out an inkjet printing of the first QDs solution on the hydrophobic top surface 121 of the substrate 12, the cohesion force of the first solute that contained in the first droplet S1 is enhanced to be greater than a driving force for impelling outward-bound flow that is induced by a coffee ring effect. As a result, the first droplet S1 is eventually converted to a first micro encapsulated QD structure RQ after applying a drying process to the first droplet S1, thereby making each of the first accommodating grooves A1 have the first micro encapsulated QD structure RQ therein.

Moreover, the present invention also configures a second quantum dots (QDs) solution that comprises at least one green quantum dot (QD), a water solvent and a second solute having a cohesion force, and the second QDs solution is dropped into each of the second accommodating grooves A2 by using an inkjet-printing nozzle, so as to form a second droplet S2 in each of the second accommodating grooves A2. Herein, it needs to explain that, the second solute has a concentration in a range between 0.5 wt % and 5.5 wt %. In addition, the green QD that is dissolved in the water solvent is also provided with a surface hydrophilic layer by receiving a surface modification treatment. According to the particular design of the present invention, in case of letting the top surface 121 of the substrate 12 be a hydrophobic surface, the cohesion force of the second solute contained in the second droplet S2 is led to be greater than a driving force for impelling outward-bound flow that is induced by a coffee ring effect. In such case, the second droplet S2 is eventually converted to a second micro encapsulated QD structure GQ after applying a drying process to the second droplet S2, thereby making each of the second accommodating grooves A2 have the second micro encapsulated QD structure GQ therein.

It is worth further explaining that, the forgoing first micro encapsulated QD structure RQ comprises a first encapsulation body that is formed by the first solute and at least one red QD that is enclosed in the first encapsulation body, and the second micro encapsulated QD structure GQ comprising a second encapsulation body that is formed by the second solute and at least one green QD that is enclosed in the second encapsulation body. Moreover, in one practicable embodiment, the first solute and the second solute are both selected from the group consisting of LiCl, NaCl, KCl, LiI, NaI, KI, LiBr, NaBr, and KBr. On the other hand, abovementioned M and N are both a positive integer. In addition, in another one practicable embodiment, a surfactant can be further added into the first QDs solution and the second QDs solution, so as to effectively reduce a formation of at least one satellite droplet in case of the first droplet and the second droplet are injected by the inkjet-printing nozzle.

Experimental Data

Inventors of the present invention have completed a first experiment and a second experiment. In the first experiment, a first sample of a QDs solution is prepared by mixing a solute and QDs into a water solvent, wherein the solute is NaCl. In addition, in the first experiment, ethylene glycol is adopted as a surfactant so as to be added into the first sample of the QDs solution. Furthermore, a transparent substrate made of PET is provided, and it is further treated to have a hydrophilic top surface.

Figure 6A:
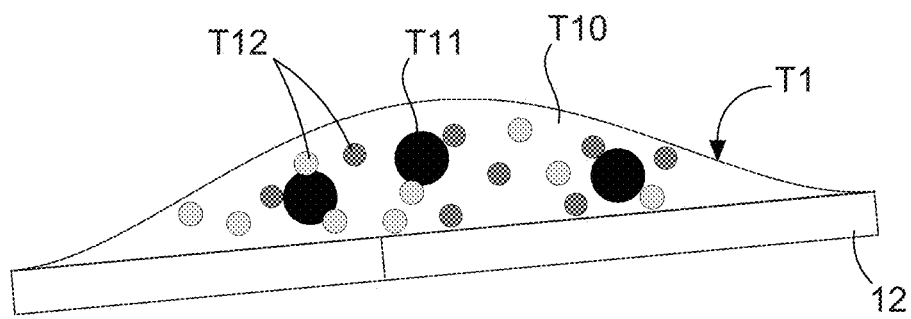
FIG. 6A, FIG. 6B and FIG. 6C show a graphical process flow for describing a first experiment.
Figure 6B:
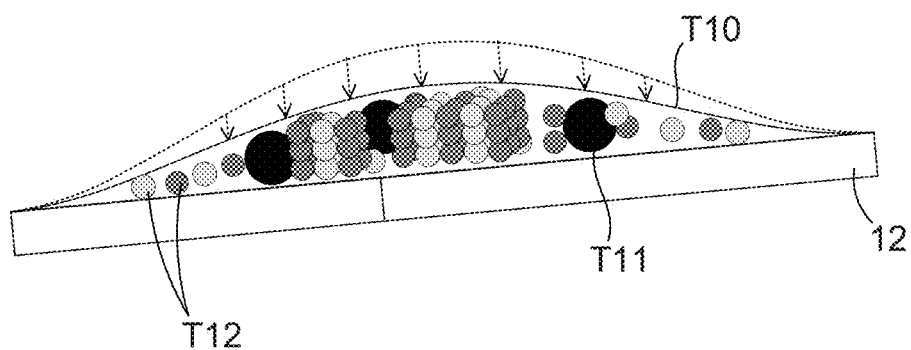
Figure 6C:
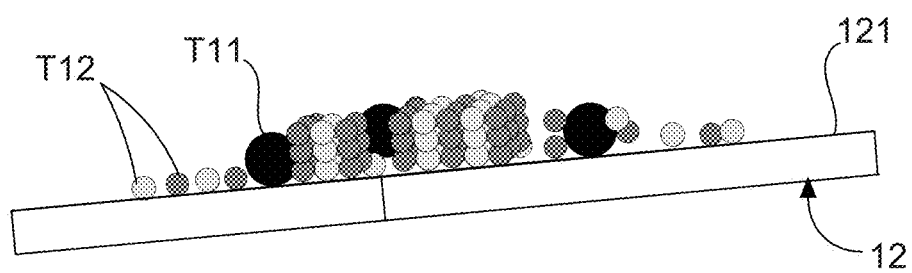
Figure 7:
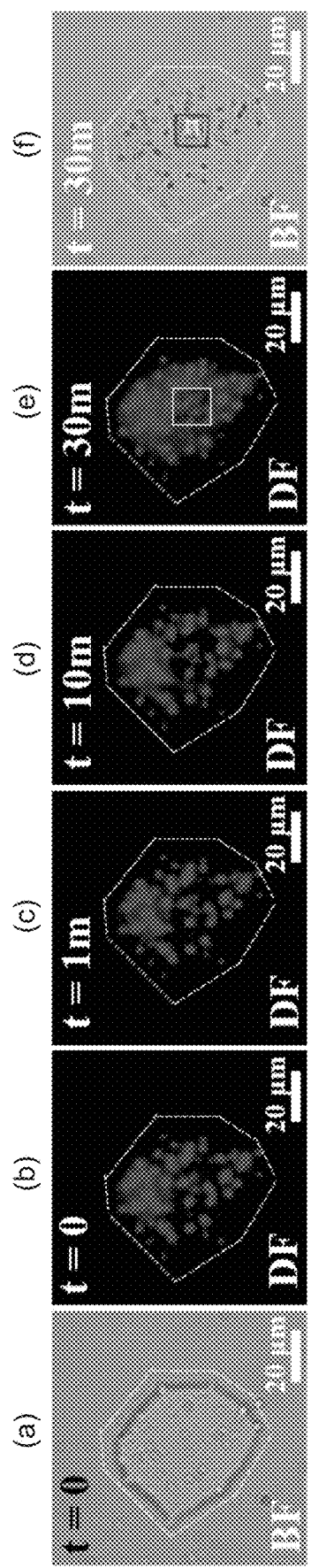
FIG. 7 shows six images that are provided by a brightfield (BF) and darkfield (DF) fluorescence microscope for describing a formation of at least one salt crystal structure that evolves with an increase of a drying time in the first experiment.

FIG. 6A, FIG. 6B and FIG. 6C show a graphical process flow for describing the first experiment. Moreover, FIG. 7 shows six images that are provided by a brightfield (BF) and darkfield (DF) fluorescence microscope for describing a formation of at least one NaCl crystal structure that evolves with an increase of a drying time in the first experiment. From FIG. 6A and images (a)-(b) of FIG. 7, it is observed that, after a first test droplet of the first sample of the QDs solution is dropped onto the hydrophilic top surface 121 of the transparent substrate 12 by using an inkjet-printing nozzle, radially outward-bound flows of the first test droplet are generated due to a driving force that is induced by a coffee-ring effect (CRE). Furthermore, as FIG. 6B, FIG. 6C and images (c)-(f) of FIG. 7 show, an adhesion force between the solute T12 and the QDs T11 makes the QDs T11 gather together with a crystal structure of the NaCl solute T12 while the water solvent is evaporated. However, it is noted that, the forgoing NaCl crystal structure is led to form by a cohesion force of the NaCl solute T12, whereas the NaCl cohesion force repels QDs out of the NaCl crystal structures. Therefore, deposition of the NaCl solute from the first test droplet on the substrate 12 is significantly influenced by the force acting at the liquid-substrate-air three-phase contact line (TCL). As a result, during the drying process of the first test droplet, the first test droplet generally leaves a ring on the substrate 12 due to capillary flow, which transports NaCl solute particles to form multi pinned droplet edge, where the water solvent evaporates, resulting in deposition of the NaCl solute at the edge (i.e., so-called coffee ring). It is worth noting that, after a drying time of 30 minutes has passed, as FIG. 6C and images (e)-(f) of FIG. 7 show, there are many NaCl crystal structures formed on the substrate 12, however it lacks a complete NaCl encapsulation crystal for well enclosing the QDs therein.

In the second experiment, a second sample of a QDs solution is prepared by mixing a solute and QDs into a water solvent, wherein the solute is NaCl. In addition, in the second experiment, ethylene glycol is adopted as a surfactant so as to be added into the second sample of the QDs solution. Furthermore, a transparent substrate 12 made of PET is provided. Particularly, the transparent substrate 12 is treated with a surface modification process so as to have a hydrophobic top surface 121.

Figure 8A:
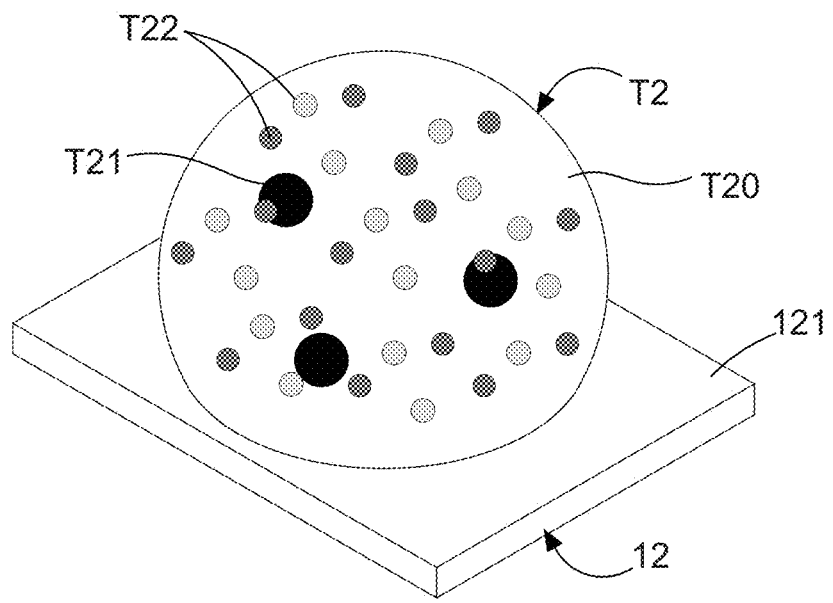
FIG. 8A, FIG. 8B and FIG. 8C show a graphical process flow for describing a second experiment.
Figure 8B:
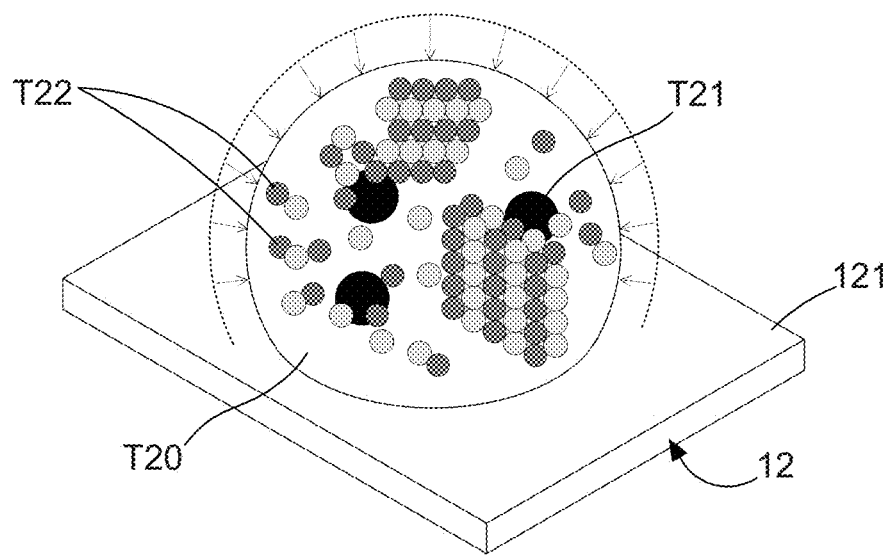
Figure 8C:
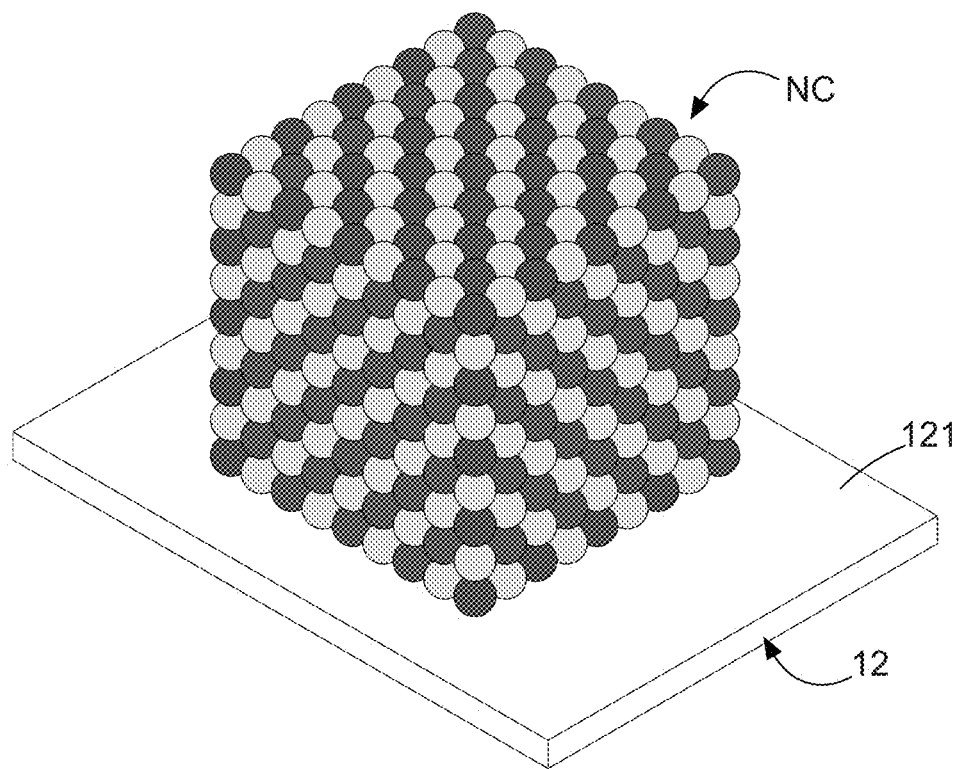
Figure 9:
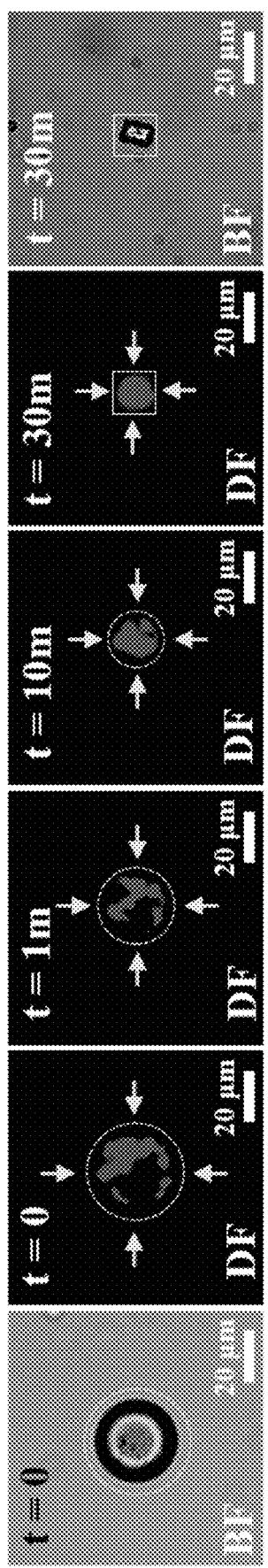
FIG. 9 shows six images that are provided by a brightfield (BF) and darkfield (DF) fluorescence microscope for describing a formation of at least one salt crystal structure that evolves with an increase of a drying time in the second experiment.

FIG. 8A, FIG. 8B and FIG. 8C show a graphical process flow for describing the forgoing second experiment. Moreover, FIG. 9 shows six images that are provided by a brightfield (BF) and darkfield (DF) fluorescence microscope for describing a formation of at least one salt crystal structure that evolves with an increase of a drying time in the second experiment. From FIG. 8A, FIG. 8B, FIG. 8C, and images (a)-(f) of FIG. 9, it is easily found that, in case of letting a top surface of the transparent substrate 12 be a hydrophobic top surface 121, a second test droplet T2 that is dropped onto the hydrophobic top surface 121 by an inkjet-printing nozzle is kept to possess a contact angle greater than 90°. It should be understood that, the hydrophobic property of the top surface 121 of the transparent substrate 12 makes the NaCl solute T22 contained in the second test droplet T2 to have an enhance cohesion force that is greater than a driving force for impelling outward-bound flow induced by coffee ring effect. As such, the drop shape of the second test droplet T2 is hence kept.

Continuously, after applying a drying process to the second test droplet T2 for making the water solvent T20 be evaporated, the volume of the second test droplet T2 shrink with an increase of a drying time, thereby forming a micro encapsulated QD structure on the substrate 12. In which, the micro encapsulated QD structure comprises an encapsulation crystal structure NC that is constituted by the NaCl solutes T22, and at least one QD T21 that is enclosed in the NaCl encapsulation crystal structure NC. In concussion, results of the second experiment have evidenced that, a deposited droplet on a hydrophobic substrate initially appears spherical because of having high contact angle) (>90°. In such case, the droplet retains both the shape and the contact angle during solvent evaporation, such that the droplet edge continuously shifts inward without pinning the substrate, resulting in a decreased droplet radius upon solvent evaporation. Consequently, QD-NaCl crystallization gradually proceeds in the ink concentrating process and finally generates a single micro encapsulated QD structure that comprises a NaCl encapsulation body and at least one QD that is enclosed in the NaCl encapsulation body.

Figure 10:
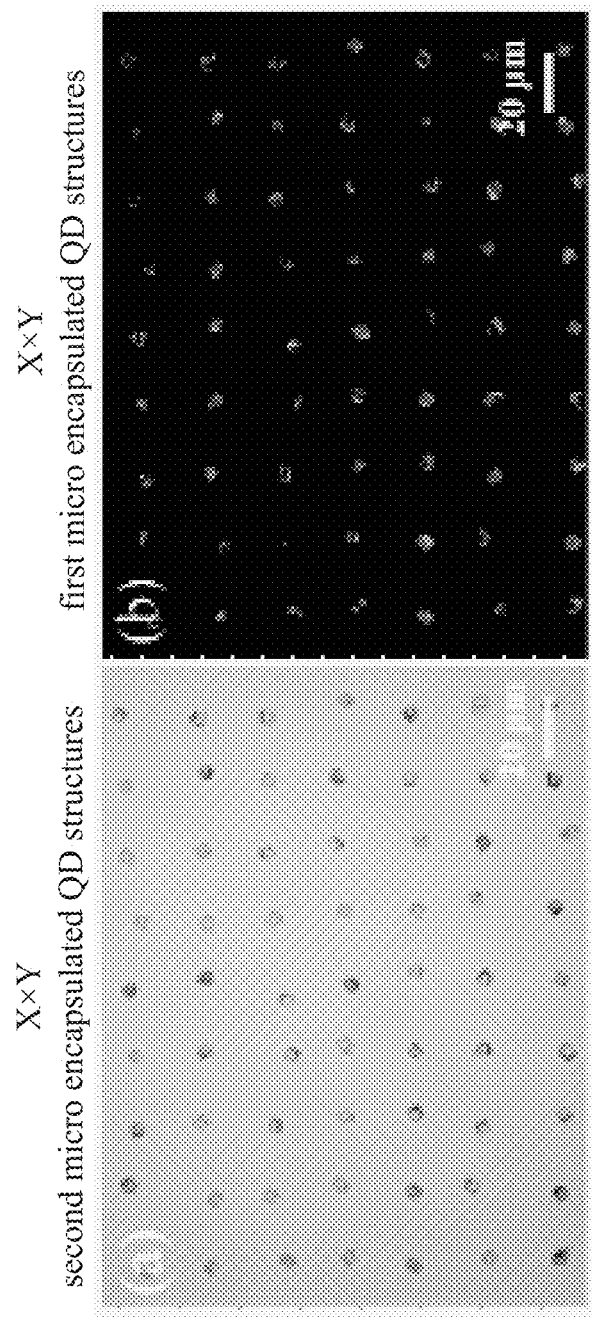
FIG. 10 shows optical microscopy images of X×Y first micro encapsulated QD structures and X×Y second micro encapsulated QD structures.

With reference to FIG. 10, there are shown optical microscopy images of X×y first micro encapsulated QD structures and X×Y second micro encapsulated QD structures. As FIG. 10 shows, a plurality of first micro encapsulated QD structures are formed on a (hydrophobic) top surface 121 of a transparent substrate 12 by using an inkjet-printing nozzle, and the plurality of first micro encapsulated QD structures are arranged to X rows and Y columns. Moreover, a plurality of second micro encapsulated QD structures are also formed on a (hydrophobic) top surface 121 of a transparent substrate 12 by using the inkjet-printing nozzle, and the plurality of second micro encapsulated QD structures are arranged to X rows and Y columns. As described in more detail below, the micro encapsulated QD structures of FIG. 10 are measured to have an average structure size in a range between 3.2 μm and 4.3 μm (i.e., 3.74±0.5 μm).

Second Embodiment

Figure 11:
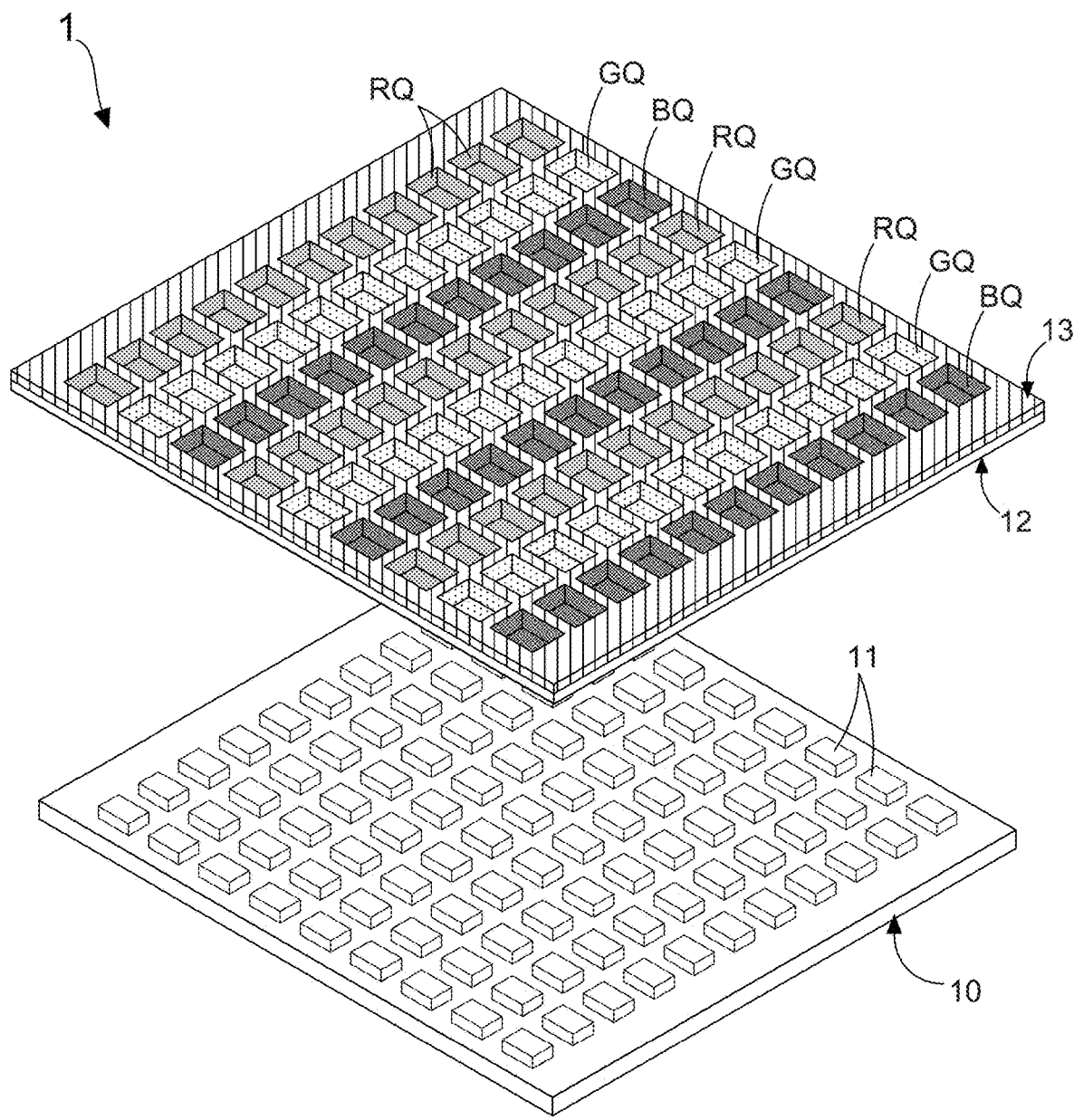
FIG. 11 shows a schematic stereo diagram of the micro LED display panel with the light conversion unit using the inkjet-printed encapsulated quantum dots according to the present invention.
Figure 12:
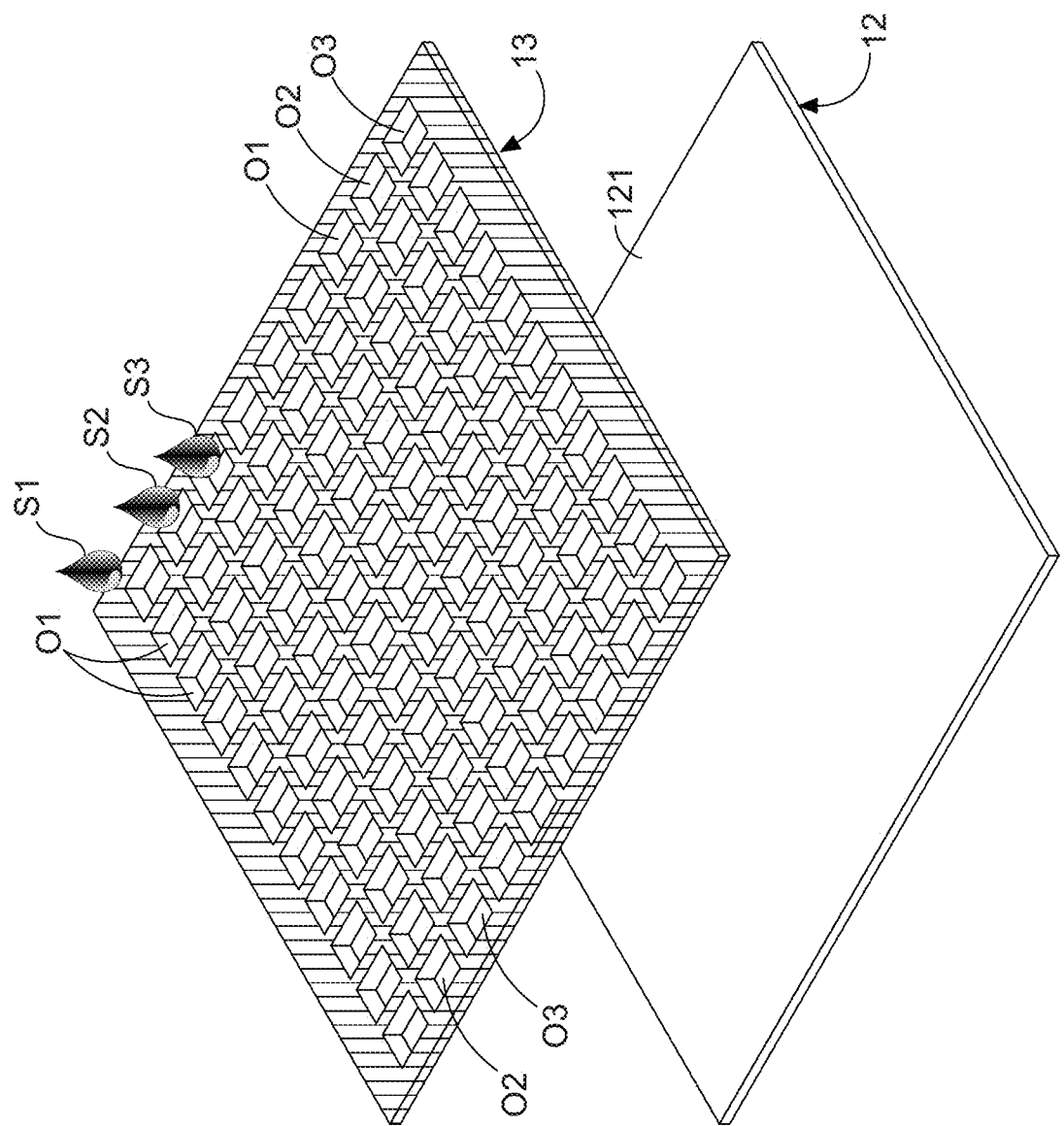
FIG. 12 shows a schematic stereo exploded diagram of the light conversion unit using the inkjet-printed encapsulated quantum dots according to the present invention.

FIG. 11 shows a schematic stereo diagram of the micro LED display panel with the light conversion unit using the inkjet-printed encapsulated quantum dots according to the present invention. In the second embodiment, the micro LED display panel 1 also comprises a substrate 10, M×N micro LED components 11, and a light conversion unit. FIG. 12 shows a schematic stereo exploded diagram of the light conversion unit using the inkjet-printed encapsulated quantum dots according to the present invention. It is worth noting that, in the second embodiment, the light conversion unit comprises: a transparent substrate 12, a light convertor carrying layer 13, a plurality of first through holes O1, a plurality of second through holes O2, a plurality of third through holes O3, (M×N)/3 first micro encapsulated QD structures RQ that are made from a first quantum dots (QDs) solution, (M×N)/3 second micro encapsulated QD structures GQ that are made from a second QDs solution, and (M×N)/3 third micro encapsulated QD structures BQ that are made from a third QDs solution.

As described in more detail below, the present invention configures the third QDs solution that comprises at least one blue QD, a water solvent and a third solute having a cohesion force, and the third QDs solution is dropped into each of the third accommodating grooves A3 by using an inkjet-printing nozzle, so as to form a third droplet S3 in each of the third accommodating grooves A3. Herein, it needs to explain that, the third solute has a concentration in a range between 0.5 wt % and 5.5 wt %, and is selected from the group consisting of LiCl, NaCl, KCl, LiI, NaI, KI, LiBr, NaBr, and KBr. On the other hand, the blue QD that is dissolved in the water solvent is provided with a surface hydrophilic layer by receiving a surface modification treatment. For example, a ligand exchanging technology can be utilized to replace an oleic acid ligand layer with a 3-mercaptopropionic acid (MPA) layer. According to the particular design of the present invention, in case of letting the top surface 121 of the substrate 12 be a hydrophobic surface, the cohesion force of the third solute contained in the third droplet S3 is led to be greater than a driving force for impelling outward-bound flow that is induced by a coffee ring effect. In such case, the third droplet S3 is eventually converted to a third micro encapsulated QD structure BQ after applying a drying process to the third droplet S3, thereby making each of the third accommodating grooves A3 have the third micro encapsulated QD structure BQ therein. The third micro encapsulated QD structure BQ comprising a third encapsulation body that is formed by the third solute and at least one blue QD that is enclosed in the third encapsulation body.

Figure 13:
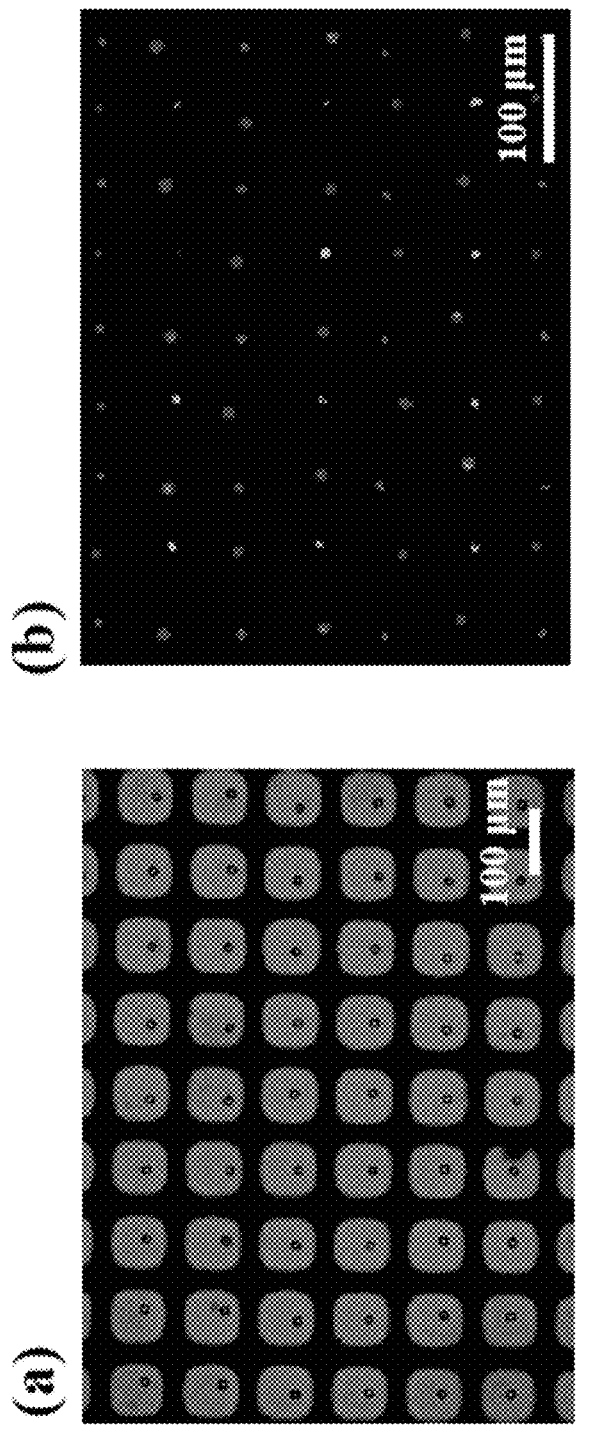
FIG. 13 shows optical microscopy images of (M×N)/3 first micro encapsulated QD structures, (M×N)/3 second micro encapsulated QD structures and (M×N)/3 third micro encapsulated QD structures that are formed on a transparent substrate.

FIG. 13 shows optical microscopy images of (M×N)/3 first micro encapsulated QD structures, (M×N)/3 second micro encapsulated QD structures and (M×N)/3 third micro encapsulated QD structures that are formed on a transparent substrate. As FIG. 13 shows, a plurality of first micro encapsulated QD structures RQ are formed on a (hydrophobic) top surface 121 of a transparent substrate 12 by using an inkjet-printing nozzle, and the plurality of first micro encapsulated QD structures RQ are arranged to M rows and N columns. Moreover, a plurality of second micro encapsulated QD structures GQ are also formed on the (hydrophobic) top surface 121 by using the inkjet-printing nozzle, and the plurality of second micro encapsulated QD structures GQ are arranged to M rows and N columns. Furthermore, a plurality of third micro encapsulated QD structures BQ are also formed on the (hydrophobic) top surface 121 by using the inkjet-printing nozzle, and the plurality of third micro encapsulated QD structures BQ are arranged to M rows and N columns. As described in more detail below, the micro encapsulated QD structures of FIG. 13 are measured to have an average structure size in a range between 3.2 μm and 4.3 μm (i.e., 3.74±0.5 μm).

Figure 14:
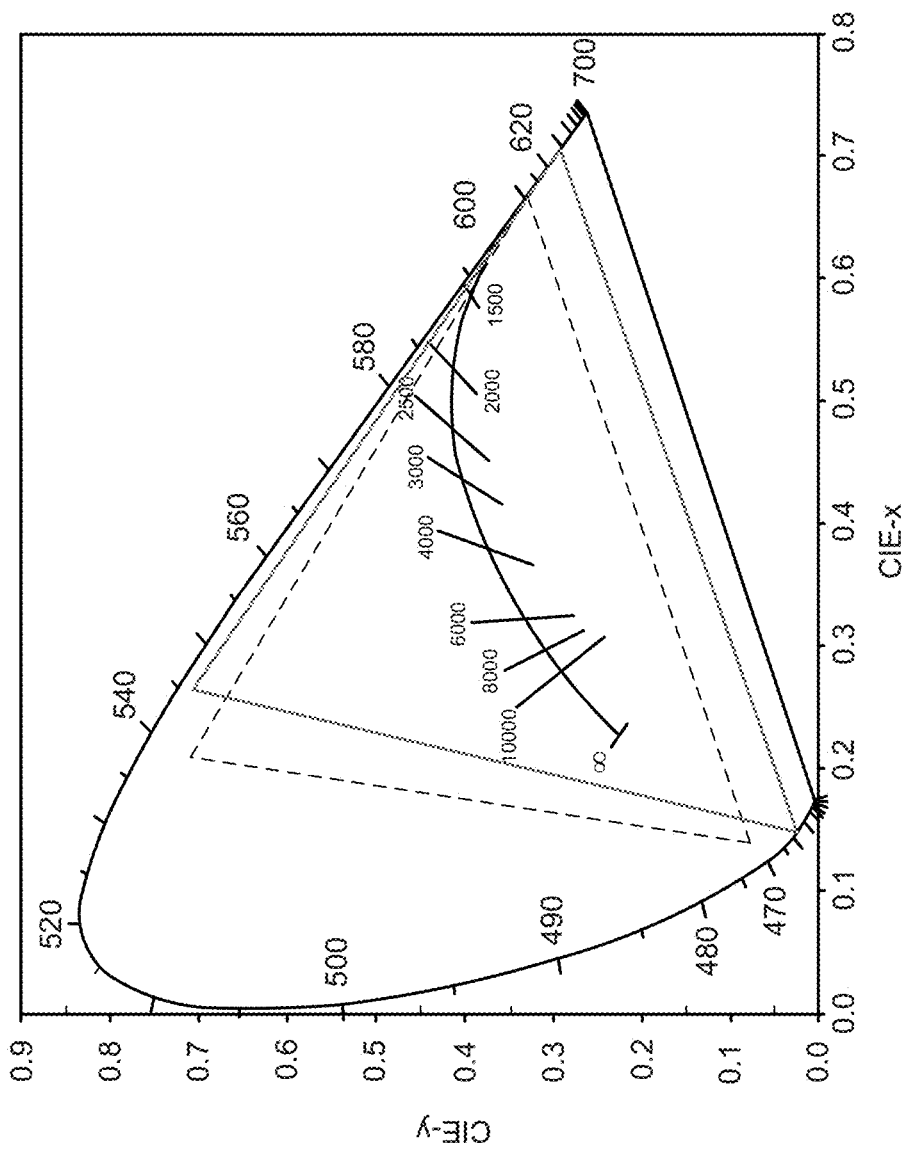
FIG. 14 shows a CIE 1931 chromaticity diagram for describing a color gamut exhibited by the micro LED display panel that is shown in FIG. 12.

In addition, FIG. 14 shows a CIE 1931 chromaticity diagram for describing a color gamut exhibited by the micro LED display panel that is shown in FIG. 12. In FIG. 14, the dotted line-drawing triangular is provided on the CIE 1931 chromaticity diagram for showing a coverage of a standard NTSC color gamut. On the contrary, the solid line-drawing triangular is provided on the CIE 1931 chromaticity diagram for showing a coverage of a color gamut that is exhibited by the micro LED display panel 1 of the present invention. It is clear that, experimental data of FIG. 14 have evidenced that, the micro LED display panel 1 using the light conversion unit having the inkjet-printed encapsulated quantum dots can exhibit a color gamut that is approximately 110% NTSC.

Figure 15:
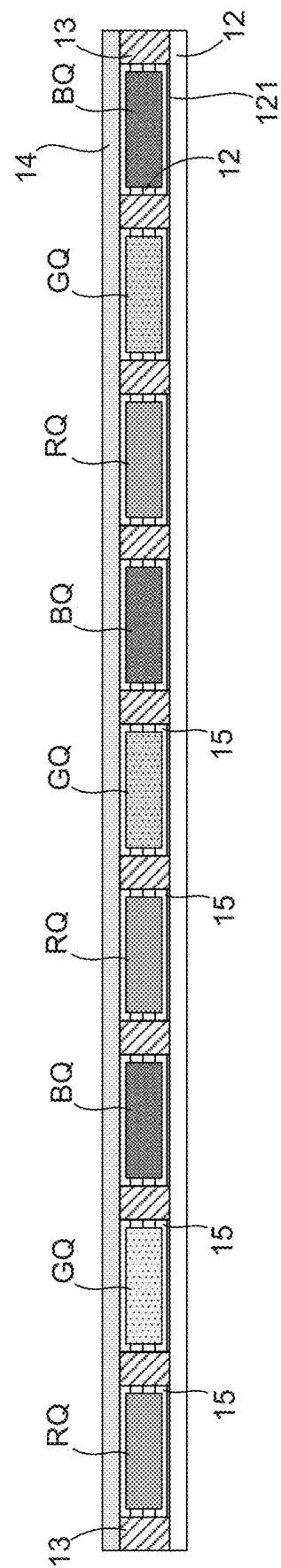
FIG. 15 shows a cross-sectional view of the light conversion unit that is shown in FIG. 12.

Furthermore, FIG. 15 shows a cross-sectional view of the light conversion unit that is shown in FIG. 12. In one practicable embodiment, the light conversion unit of the present invention is able to further comprise an encapsulation material 15 and a barrier layer 14. In which, the encapsulation material 15 is filled into each of the first accommodating grooves A1, each of the second accommodating grooves A2 and each of the third accommodating grooves A3, so as to enclose the first micro encapsulated QD structure RQ, the second micro encapsulated QD structure GQ and the third micro encapsulated QD structure BQ in the first accommodating groove A1, the second accommodating groove A2 and the third accommodating groove A3, respectively. On the other hand, the barrier layer 14 is disposed on the light convertor carrying layer 13 for covering all the first accommodating grooves A1, the second accommodating grooves A2 and the third accommodating grooves A3, and is used for blocking moisture and oxygen.

Therefore, through above descriptions, all embodiments and their constituting elements of the method for making inkjet-printed encapsulated quantum dots, the light conversion unit having the inkjet-printed encapsulated quantum dots, and micro LED display panel using the light conversion unit proposed by the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A method for making inkjet-printed encapsulated quantum dots, comprising steps of:

providing a substrate having a hydrophobic surface and a quantum dots (QDs) solution comprising at least one quantum dot (QD), a water solvent and a solute having a cohesion force;

using an inkjet-printing nozzle to carry out an inkjet printing of the QDs solution on the hydrophobic surface of the substrate, such that a droplet of the QDs solution is formed on the hydrophobic surface; and applying a drying process to the droplet of the QDs solution, so as to make a volume of the droplet shrink with an increase of a drying time, thereby forming a micro encapsulated QD structure on the substrate.

2. The method of claim 1, wherein the micro encapsulated QD structure comprises an encapsulation body that is formed by the solute and at least one QD that is enclosed in the encapsulation body.

3. The method of claim 1, wherein the solute has a concentration in a range between 0.5 wt % and 5.5 wt %, and being made of a material that is selected from the group consisting of LiCl, NaCl, KCl, LiI, NaI, KI, LiBr, NaBr, an KBr.

4. The method of claim 1, wherein a surfactant is further added into the QDs solution, so as to effectively reduce a formation of at least one satellite droplets in case of the droplet of the QDs solution is dropped onto the hydrophobic surface of the substrate through the inkjet-printing nozzle.

5. The method of claim 1, wherein the QD has a hydrophilic layer that is formed by applying a surface modification process to the QD, and the QD is selected from the group consisting of red QD, green QD and blue QD.

6. A light conversion unit, comprising:
a transparent substrate;
a light convertor carrying layer, being formed on a top surface of the transparent substrate, and being made of a metal material or a metal oxide material;
a plurality of first through holes, being formed on the light convertor carrying layer, and being arranged to M/3 rows and M/3 columns, wherein each of the plurality of first through holes form a first accommodating groove in combination with the top surface of the transparent substrate;
a plurality of second through holes, being formed on the light convertor carrying layer, and being arranged to M/3 rows and M/3 columns, wherein each of the plurality of second through holes form a second accommodating groove in combination with the top surface of the transparent substrate;
a plurality of third through holes, being formed on the light convertor carrying layer, and being arranged to M/3 rows and M/3 columns, wherein each of the plurality of third through holes form a third accommodating groove in combination with the top surface of the transparent substrate;
a first quantum dots (QDs) solution, comprising at least one red quantum dot (QD), a water solvent and a first solute having a cohesion force, wherein the first QDs solution is dropped into each of the first accommodating grooves by using an inkjet-printing nozzle, so as to form a first droplet in each of the first accommodating grooves; and
a second QDs solution, comprising at least one green QD, the water solvent and a second solute having the cohesion force, wherein the second QDs solution is dropped into each of the second accommodating grooves by using the inkjet-printing nozzle, so as to form a second droplet in each of the second accommodating grooves;
wherein in case of letting the top surface of the substrate be a hydrophobic surface so as to make the cohesion force of the first solute and the cohesion force of the second solute be both greater than a driving force for impelling outward-bound flow that is induced by a coffee ring effect, the first droplet and the second droplet being eventually converted to a first micro encapsulated QD structure and a second micro encapsulated QD structure after applying a drying process to the first droplet and the second droplet, thereby making each of the first accommodating grooves have the first micro encapsulated QD structure therein, and simultaneously making each of the second accommodating grooves have the second micro encapsulated QD structure therein;
wherein M and N are both a positive integer.

7. The light conversion unit of claim 6, further comprising a third QDs solution that comprises at least one blue QD, the water solvent and a third solute having the cohesion force, wherein the third QDs solution is dropped into each of the third accommodating grooves by using the inkjet-printing nozzle, so as to form a third droplet in each of the third accommodating grooves; wherein the third droplet is eventually converted to a third micro encapsulated QD structure after applying the drying process to the third droplet, thereby making each of the third accommodating grooves have the third micro encapsulated QD structure therein.

8. The light conversion unit of claim 7, wherein the first micro encapsulated QD structure comprises a first encapsulation body that is formed by the first solute and at least one red QD that is enclosed in the first encapsulation body, the second micro encapsulated QD structure comprising a second encapsulation body that is formed by the second solute and at least one green QD that is enclosed in the second encapsulation body, and the third micro encapsulated QD structure comprising a third encapsulation body that is formed by the third solute and at least one blue QD that is enclosed in the third encapsulation body.

9. The light conversion unit of claim 7, further comprising:
an encapsulation material, being filled into each of the first accommodating grooves, each of the second accommodating grooves and each of the third accommodating grooves, so as to enclose the first micro encapsulated QD structure, the second micro encapsulated QD structure and the third micro encapsulated QD structure in the first accommodating groove, the second accommodating groove and the third accommodating groove, respectively; and
a barrier layer, being disposed on the light convertor carrying layer for covering all the first accommodating grooves, the second accommodating grooves and the third accommodating grooves, and being used for blocking moisture and oxygen.

10. The light conversion unit of claim 6, wherein the metal material is selected from the group consisting of gold (Au), copper (Cu), aluminum (Al), silver (Ag), chromium (Cr), molybdenum (Mo), titanium (Ti), indium (In), antimony (Sb), and alloy comprising two or more of the forgoing metal materials.

11. The light conversion unit of claim 6, wherein the metal oxide material is selected from the group consisting of copper oxide, aluminum oxide, silver oxide, chromium oxide, molybdenum oxide, titanium oxide, indium oxide, antimony oxide, and compound comprising two or more of the forgoing metal oxide materials.

12. The light conversion unit of claim 6, wherein the first solute, the second solute and the third solute are all selected from the group consisting of LiCl, NaCl, KCl, LiI, NaI, KI, LiBr, NaBr, and KBr.

13. The light conversion unit of claim 6, wherein a surfactant is further added into the first QDs solution, the second QDs solution and the third QDs solution, so as to effectively reduce a formation of at least one satellite droplet in case of the first droplet, the second droplet and the third droplet are injected by the inkjet-printing nozzle.

14. The light conversion unit of claim 6, wherein the red QD, the green QD and the blue QD are all provided with a surface hydrophilic layer after a surface modification process is applied to the red QD, the green QD and the blue QD, and the first solute, the second solute and the third solute all having a concentration in a range between 0.5 wt % and 5.5 wt %.

15. A micro LED display panel, comprising:
a substrate;
M×N micro LED components, being disposed on the substrate;
a transparent substrate, being disposed on the substrate and the M×N micro LED components;
a light convertor carrying layer, being formed on a top surface of the transparent substrate, and being made of a metal material or a metal oxide material;
a plurality of first through holes, being formed on the light convertor carrying layer, and being arranged to M/3 rows and M/3 columns, wherein each of the plurality of first through holes form a first accommodating groove in combination with the top surface of the transparent substrate;
a plurality of second through holes, being formed on the light convertor carrying layer, and being arranged to M/3 rows and M/3 columns, wherein each of the plurality of second through holes form a second accommodating groove in combination with the top surface of the transparent substrate;
a plurality of third through holes, being formed on the light convertor carrying layer, and being arranged to M/3 rows and M/3 columns, wherein each of the plurality of third through holes form a third accommodating groove in combination with the top surface of the transparent substrate;
a first quantum dots (QDs) solution, comprising at least one red quantum dot (QD), a water solvent and a first solute having a cohesion force, wherein the first QDs solution is dropped into each of the first accommodating grooves by using an inkjet-printing nozzle, so as to form a first droplet in each of the first accommodating grooves; and
a second QDs solution, comprising at least one green QD, the water solvent and a second solute having the cohesion force, wherein the second QDs solution is dropped into each of the second accommodating grooves by using the inkjet-printing nozzle, so as to form a second droplet in each of the second accommodating grooves;
wherein in case of letting the top surface of the substrate be a hydrophobic surface so as to make the cohesion force of the first solute and the cohesion force of the second solute be both greater than a driving force for impelling outward-bound flow that is induced by a coffee ring effect, the first droplet and the second droplet being eventually converted to a first micro encapsulated QD structure and a second micro encapsulated QD structure after applying a drying process to the first droplet and the second droplet, thereby making each of the first accommodating grooves have the first micro encapsulated QD structure therein, and simultaneously making each of the second accommodating grooves have the second micro encapsulated QD structure therein;
wherein M and N are both a positive integer.

16. The micro LED display panel of claim 15, further comprising a third QDs solution that comprises at least one blue QD, the water solvent and a third solute having the cohesion force, wherein the third QDs solution is dropped into each of the third accommodating grooves by using the inkjet-printing nozzle, so as to form a third droplet in each of the third accommodating grooves; wherein the third droplet is eventually converted to a third micro encapsulated QD structure after applying the drying process to the third droplet, thereby making each of the third accommodating grooves have the third micro encapsulated QD structure therein.

17. The micro LED display panel of claim 16, wherein the first micro encapsulated QD structure comprises a first encapsulation body that is formed by the first solute and at least one red QD that is enclosed in the first encapsulation body, the second micro encapsulated QD structure comprising a second encapsulation body that is formed by the second solute and at least one green QD that is enclosed in the second encapsulation body, and the third micro encapsulated QD structure comprising a third encapsulation body that is formed by the third solute and at least one blue QD that is enclosed in the third encapsulation body.

18. The micro LED display panel of claim 16, wherein the first solute, the second solute and the third solute are all selected from the group consisting of LiCl, NaCl, KCl, LiI, NaI, KI, LiBr, NaBr, and KBr.

19. The micro LED display panel of claim of claim 16, wherein the red QD, the green QD and the blue QD are all provided with a surface hydrophilic layer after a surface modification process is applied to the red QD, the green QD and the blue QD, and the first solute, the second solute and the third solute all having a concentration in a range between 0.5 wt % and 5.5 wt %.

20. The micro LED display panel of claim 16, wherein a surfactant is further added into the first QDs solution, the second QDs solution and the third QDs solution, so as to effectively reduce a formation of at least one satellite droplet in case of the first droplet, the second droplet and the third droplet are injected by the inkjet-printing nozzle.

* * * * *